US012733549B2

(12) United States Patent
Mun et al.

(10) Patent No.: US 12,733,549 B2
(45) Date of Patent: Sep. 8, 2026

(54) SEMICONDUCTOR PACKAGE

(71) Applicant: Samsung Electronics Co., Ltd., Suwon-si (KR)

(72) Inventors: Kyung Don Mun, Suwon-si (KR); Sang Cheon Park, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 448 days.

(21) Appl. No.: 18/312,331

(22) Filed: May 4, 2023

(65) Prior Publication Data

US 2024/0120318 A1 Apr. 11, 2024

(30) Foreign Application Priority Data

Oct. 6, 2022 (KR) ........................ 10-2022-0127582

(51) Int. Cl.

*H10W 90/00* (2026.01)
*H10B 80/00* (2023.01)
*H10W 20/42* (2026.01)
*H10W 74/10* (2026.01)

(52) U.S. Cl.

CPC ............ *H10W 90/00* (2026.01); *H10B 80/00* (2023.02); *H10W 20/42* (2026.01); *H10W 74/111* (2026.01); *H10W 90/792* (2026.01)

(58) Field of Classification Search

CPC ............ H01L 25/0657; H01L 23/3107; H01L 23/5226; H01L 24/08; H10W 90/00; H10W 20/42; H10W 74/111; H10W 90/792; H10B 80/00

See application file for complete search history.

(56) References Cited

U.S. PATENT DOCUMENTS 8,461,017 B2 6/2013 Sadaka et al.
9,502,345 B2 * 11/2016 Youn .................... H10W 72/00
10,026,716 B2 7/2018 Yu et al.
10,468,381 B2 11/2019 Zhai
10,510,592 B2 * 12/2019 Kao .................... H10W 20/056

(Continued)

FOREIGN PATENT DOCUMENTS

CN 109801897 A * 5/2019
CN 111799228 A * 10/2020 ........ H10W 20/0245

(Continued)

*Primary Examiner* — Laura M Menz

(74) *Attorney, Agent, or Firm* — HARNESS, DICKEY & PIERCE, P.L.C.

(57) ABSTRACT

A semiconductor package includes a buffer die, semiconductor chip stacks stacked on the buffer die, each of the semiconductor chip stacks including a plurality of first semiconductor chips and a second semiconductor chip on the plurality of first semiconductor chips, and a mold layer covering an upper surface of the buffer die and side surfaces of the semiconductor chip stacks. Each of the first semiconductor chips and the second semiconductor chip includes a wiring part including multilayer wirings, an upper connection structure on the wiring part and having a plurality of upper conductive pads and a lower connection structure under the wiring part and having a plurality of lower conductive pads, and the second semiconductor chip further includes a redistribution layer on the upper connection structure and having an insulating layer and a plurality of redistribution pads in the insulating layer.

20 Claims, 14 Drawing Sheets

(56) References Cited

U.S. PATENT DOCUMENTS 10,510,629 B2 * 12/2019 Chen .................. H10W 40/778
10,784,244 B2 * 9/2020 Han .................. H10W 90/00
10,818,640 B1 * 10/2020 Yu .................. H10P 72/74
10,868,073 B2 * 12/2020 Kang .................. H10F 39/809
10,886,255 B2 * 1/2021 Hong .................. H10W 74/121
10,937,736 B2 * 3/2021 Yu .................. H10P 72/74
10,971,470 B2 4/2021 Kim et al.
11,031,285 B2 6/2021 Katkar et al.
11,145,626 B2 * 10/2021 Hwang .................. H10W 20/023
11,239,203 B2 * 2/2022 Gaide .................. H10W 90/00
11,244,904 B2 * 2/2022 Ryu .................. H10P 72/74
11,282,792 B2 * 3/2022 Jee .................. H10W 70/611
11,380,655 B2 * 7/2022 Yu .................. H10P 72/74
11,637,089 B2 * 4/2023 Choi .................. H10W 70/611
257/773
11,676,902 B2 * 6/2023 Ryu .................. H10P 72/74
257/774
11,869,877 B2 * 1/2024 Hou .................. H10W 20/023
11,916,002 B2 * 2/2024 Kang .................. H10W 70/685
12,080,684 B2 * 9/2024 Yu .................. H10P 72/74
12,183,665 B2 * 12/2024 Kang .................. H10W 70/685
12,230,622 B2 * 2/2025 Yang .................. H10W 90/00
12,453,087 B2 * 10/2025 Lee .................. H10B 12/50
2011/0037158 A1 * 2/2011 Youn .................. H10W 72/00
257/692
2013/0161788 A1 * 6/2013 Chun .................. H10W 72/00
257/532
2018/0025970 A1 * 1/2018 Kao .................. H10W 20/056
257/401
2019/0355637 A1 * 11/2019 Chen .................. H10W 40/778
2020/0135683 A1 * 4/2020 Kim .................. H10W 20/023
2020/0135698 A1 * 4/2020 Hong .................. H10W 74/121
2020/0135699 A1 * 4/2020 Hwang .................. H10W 20/023
2020/0168550 A1 * 5/2020 Ryu .................. H10P 72/74
2020/0272564 A1 * 8/2020 Keeth .................. G06F 12/0653
2020/0321315 A1 * 10/2020 Yu .................. H10P 72/74
2021/0005553 A1 * 1/2021 Jee .................. H10W 70/611
2021/0043608 A1 * 2/2021 Yu .................. H10P 72/74
2021/0125955 A1 4/2021 Suh et al.
2021/0200699 A1 * 7/2021 Keeth .................. G06F 13/1668
2022/0020403 A1 * 1/2022 Limaye .................. G11C 5/06
2022/0059440 A1 * 2/2022 Kang .................. H10W 74/117
2022/0059466 A1 * 2/2022 Song .................. H10P 72/74
2022/0093571 A1 3/2022 Chen et al.
2022/0130767 A1 * 4/2022 Ryu .................. H10P 72/74
2022/0130793 A1 * 4/2022 Kang .................. H10W 90/00
2022/0173044 A1 * 6/2022 Jee .................. H10W 70/611
2022/0189907 A1 * 6/2022 Nam .................. H10W 42/121
2022/0344306 A1 * 10/2022 Yu .................. H10P 72/74
2022/0352061 A1 * 11/2022 Kang .................. H10W 70/685
2023/0021376 A1 * 1/2023 Lee .................. H10B 12/50
2023/0110957 A1 * 4/2023 Yang .................. H10W 90/00
361/783
2023/0133116 A1 * 5/2023 Jang .................. H10W 90/00
257/774
2023/0178533 A1 * 6/2023 Jeon .................. H10W 90/00
257/738
2024/0032312 A1 * 1/2024 Lee .................. H10B 80/00
2024/0063193 A1 * 2/2024 Mun .................. H10W 90/00
2024/0120318 A1 * 4/2024 Mun .................. H10W 20/023
2024/0162133 A1 * 5/2024 Kang .................. H10W 70/685
2024/0186290 A1 * 6/2024 Kim .................. H10W 74/117
2024/0222273 A1 * 7/2024 Chung .................. H10W 20/43
2024/0363590 A1 * 10/2024 Yu .................. H10P 72/74
2025/0015048 A1 * 1/2025 Chung .................. H10B 80/00
2025/0062210 A1 * 2/2025 Kim .................. H10W 70/65
2025/0079250 A1 * 3/2025 Ko .................. H10B 80/00
2025/0079424 A1 * 3/2025 Chung .................. H10W 90/00
2025/0096214 A1 * 3/2025 Chung .................. H10W 74/016
2025/0096215 A1 * 3/2025 Chung .................. H10W 74/114
2025/0118646 A1 * 4/2025 Kang .................. H10W 70/685
2025/0149519 A1 * 5/2025 Chung .................. H10W 90/00
2025/0167193 A1 * 5/2025 Yang .................. H10W 20/427
2025/0183243 A1 * 6/2025 Chung .................. H10W 20/20
2025/0233042 A1 * 7/2025 Tong .................. H10W 40/25
2025/0233045 A1 * 7/2025 Tong .................. H10W 40/258
2025/0300111 A1 * 9/2025 Yang .................. H10W 74/43
2025/0309126 A1 * 10/2025 Zhai .................. H10W 70/611
2025/0336835 A1 * 10/2025 Yim .................. H10W 70/611
2025/0349731 A1 * 11/2025 Jeon .................. H10W 70/611

FOREIGN PATENT DOCUMENTS

CN 112185930 A * 1/2021 .......... H10W 90/701
CN 111799228 B * 6/2022 .......... H10W 20/0245
CN 115966563 A * 4/2023 .......... H10W 90/701
CN 117766484 A * 3/2024 .......... H10W 70/65
CN 112185930 B * 5/2024 .......... H10W 90/701
DE 102019109592 A1 * 10/2020 .......... H10W 20/0245
DE 102019109592 B4 * 3/2024 .......... H10W 20/0245
EP 4167690 A1 * 4/2023 .......... H10W 90/701
EP 4391050 A1 * 6/2024 .......... H10W 80/00
JP 2013135225 A * 7/2013 .......... H10W 90/00
KR 20130079093 A * 7/2013 .......... H10W 72/00
KR 20200117815 A * 10/2020 .......... H10W 20/0245
KR 20210005436 A * 1/2021 .......... H10W 90/701
KR 102318303 B1 * 10/2021 .......... H10W 20/0245
KR 20220025629 A * 3/2022 .......... H01L 24/46
KR 20240048586 A * 4/2024 .......... H10W 20/0245
KR 102696464 B1 * 8/2024 .......... H10W 90/701
KR 102766577 B1 * 2/2025 .......... H10B 12/00
KR 20250083358 A * 6/2025 .......... H10W 90/401
KR 20250157595 A * 11/2025 .......... H10W 90/00
TW 202335213 A * 9/2023 .......... H10W 20/0245
WO WO-2025207325 A1 * 10/2025 .......... H10W 90/00

* cited by examiner 101a
101
101b
IMD
PL1
MR
VA
105
107
R1
CT
TVL
TSV
SR1
ILD
TC
R1
DP
TE1
110
WF1
BL1
CR1

101a
101
101b
IMD
PL1
MR
VA
105
107
R1
CT
TVL
TSV
SR1
ILD
TC
R1
DP
TE1
110
WF1
BL1
CR1

120
PL1
IMD
101b
101
101a
PL2
BL2
CR2
VA
105
RC
DP
TE1
107
ILD
SR1
TE1
TC
R1
R1
TE2
107
CT
TVL
TSV
110
TE1
WF1

130
120
PL1
IMD
101b
101
101a
PL2
BL2
CR2
R1
VA
105
RC
DP
TE1
107
ILD
TE2
107
CT
TVL
TSV
SR1
R1
TE1
TC
TC3
TR3
110
TE1
WF1

130
120
PL1
IMD
101b
101
101a
PL2
BL2
CR2
VA
105
RC
DP
TE1
107
ILD
R1
TE2
107
CT
TVL
TSV
SR1
TE1
TC
TC3
TR3
R1
110
TE1
WF1

SEMICONDUCTOR PACKAGE

CROSS-REFERENCE TO RELATED APPLICATIONS

This U.S. non-provisional patent application claims priority under 35 U.S.C. § 119 to Korean Patent Application No. 10-2022-0127582, filed on Oct. 6, 2022, in the Korean Intellectual Property Office, the entire contents of which are hereby incorporated by reference.

BACKGROUND

The inventive concepts relate to a semiconductor package, and more particularly, relates to a semiconductor package including a semiconductor chip stack.

An integrated circuit chip is provided with a semiconductor package so as to be suitably applied to an electronic product. In a general semiconductor package, an integrated circuit chip is mounted on a printed circuit board (PCB) and is electrically connected to the PCB through bonding wirings or bumps. Research for improving reliability and/or durability of a semiconductor package have been conducted with the development of an electronic industry.

SUMMARY

An aspect of the inventive concepts is to provide a semiconductor package with improved reliability and stability.

A semiconductor package according to some example embodiments of the inventive concepts includes a buffer die, semiconductor chip stacks stacked on the buffer die, each of the semiconductor chip stacks including a plurality of first semiconductor chips and at least one second semiconductor chip on the plurality of first semiconductor chips, and a mold layer covering an upper surface of the buffer die and side surfaces of the semiconductor chip stacks. Each of the first semiconductor chips and the second semiconductor chip includes a wiring part including multilayer wirings, an upper connection structure on the wiring part and having a plurality of upper conductive pads, and a lower connection structure under the wiring part and having a plurality of lower conductive pads, and the at least one second semiconductor chip further includes a redistribution layer on the upper connection structure and having an insulating layer and a plurality of redistribution pads in the insulating layer.

A semiconductor package according to some example embodiments of the inventive concepts includes semiconductor chip stacks stacked on each other, each of the semiconductor chip stacks including a plurality of first semiconductor chips and at least one second semiconductor chip on the plurality of first semiconductor chips. Each of the first semiconductor chips and the at least one second semiconductor chips includes a wiring part including multilayer wirings, an upper connection structure on the wiring part and having a plurality of upper conductive pads, and a lower connection structure under the wiring part and having a plurality of lower conductive pads, the at least one second semiconductor chip further includes a redistribution layer on the upper connection structure and having an insulating layer and a plurality of redistribution pads in the insulating layer, and each of the semiconductor chip stacks includes the same number of first semiconductor chips as each other.

A semiconductor package according to some example embodiments of the inventive concepts includes a buffer die, semiconductor chip stacks stacked on the buffer die, each of the semiconductor chip stacks including a plurality of first semiconductor chips and at least one second semiconductor chip on the plurality of first semiconductor chips, and a mold layer covering an upper surface of the buffer die and side surfaces of the semiconductor chip stacks. Each of the first semiconductor chips and the at least one second semiconductor chip includes a wiring part including multilayer wirings, a lower connection structure under the wiring part and having a plurality of lower conductive pads, and an upper connection structure on the wiring part and having a plurality of upper conductive pads, the at least one second semiconductor further includes a redistribution layer on the upper connection structure and having an insulating layer and a plurality of redistribution pads in the insulating layer, and the upper connection structure includes a first passivation layer covering an upper surface of the wiring part and having the plurality of upper conductive pads therein and first conductive pads provided on the plurality of upper conductive pads in the first passivation layer and having a recessed upper region.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Hereinafter, to explain the inventive concepts in more detail, example embodiments according to the inventive concepts will be described in more detail with reference to the accompanying drawings.

Figure 1:
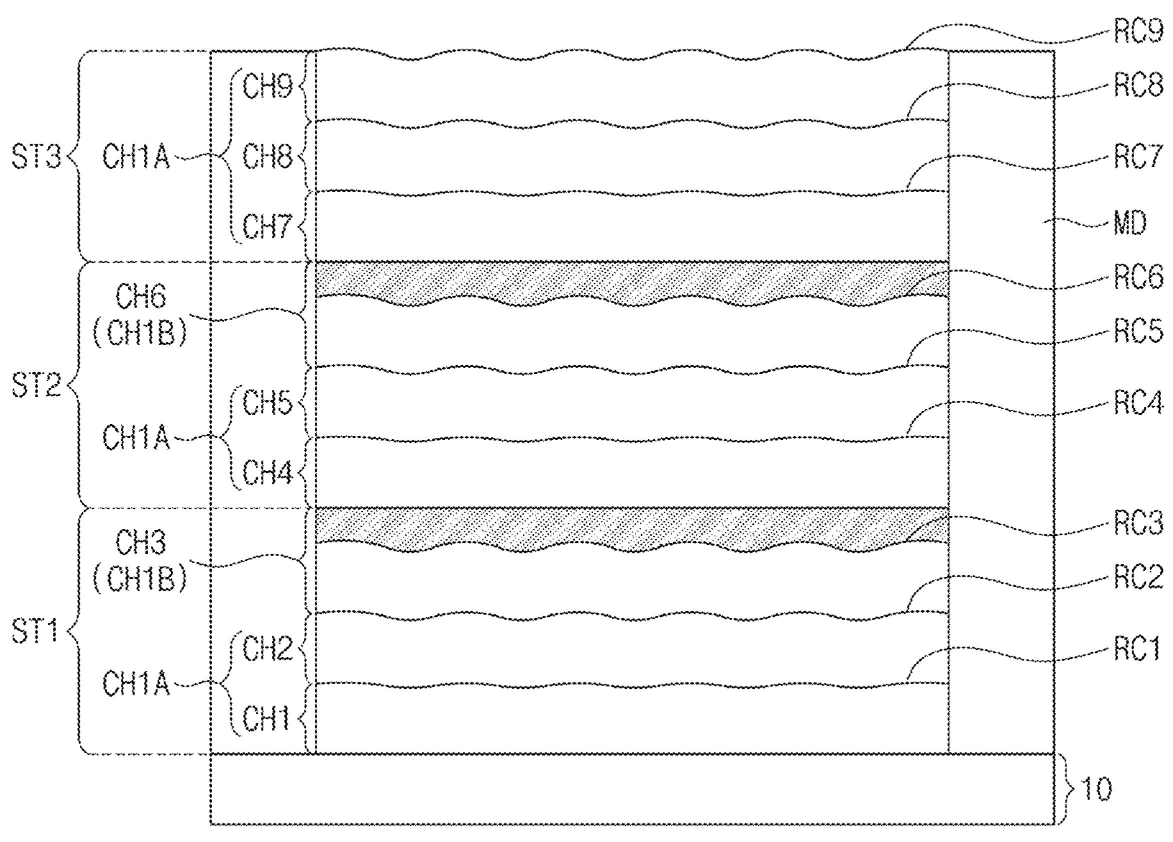
FIG. 1 is a schematic diagram of a semiconductor package according to example embodiments of the inventive concepts.
Figure 2:
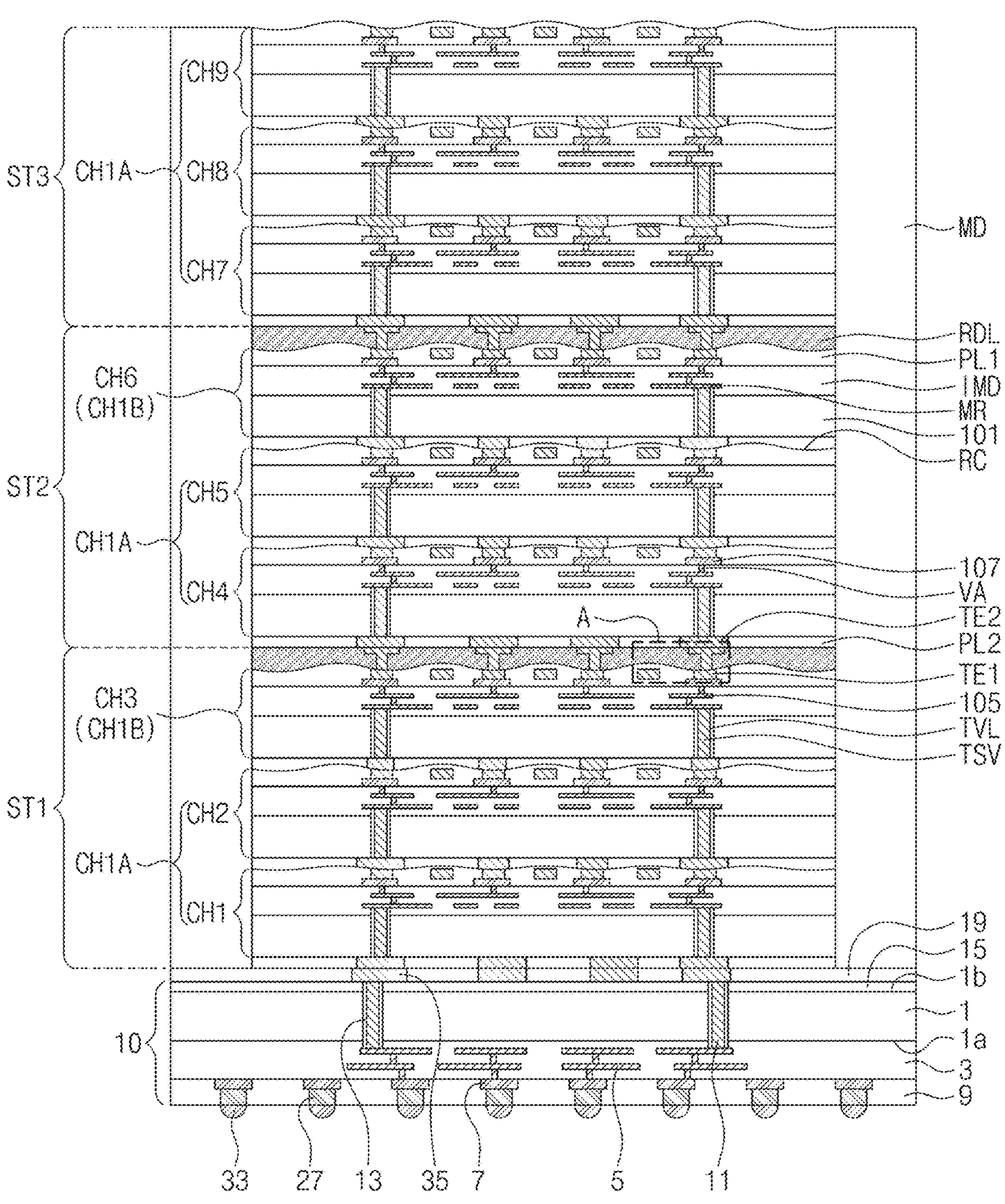
FIG. 2 is a cross-sectional view of a semiconductor package according to example embodiments of the inventive concepts.
Figure 3:
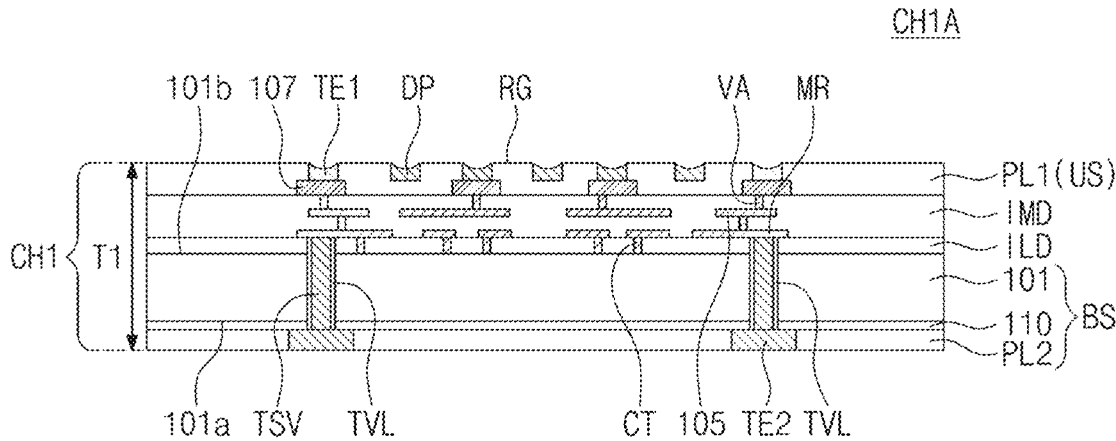
FIG. 3 is a cross-sectional view illustrating a first semiconductor chip of the semiconductor package of FIG. 2.
Figure 4:
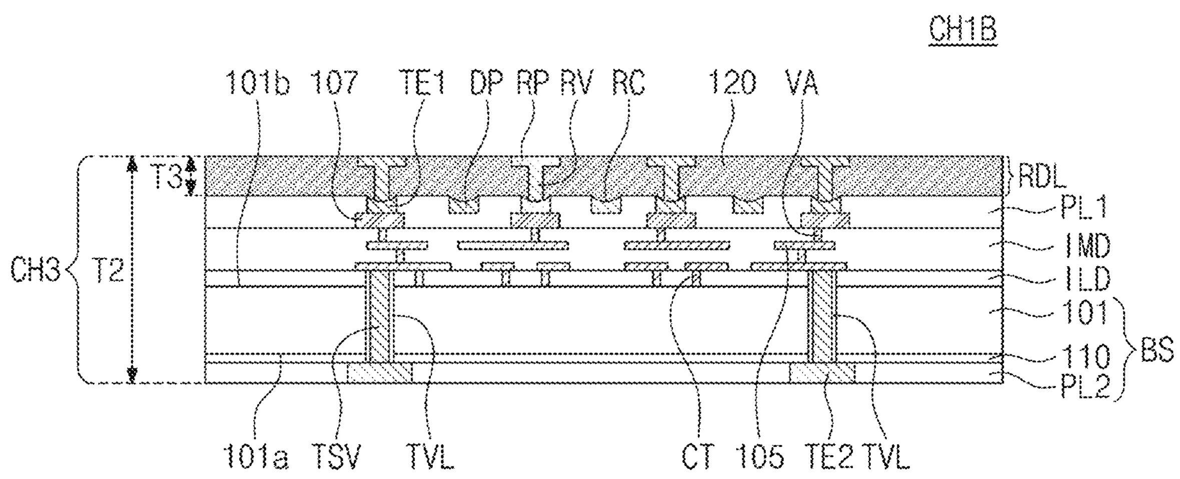
FIG. 4 is a cross-sectional view illustrating a second semiconductor chip of the semiconductor package of FIG. 2.
Figure 5:
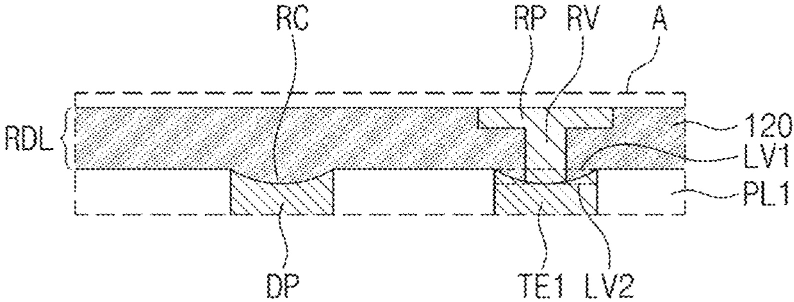
FIG. 5 is an enlarged view illustrating an enlarged portion 'A' of FIG. 2.

FIG. 1 is a schematic diagram of a semiconductor package according to example embodiments of the inventive concepts, FIG. 2 is a cross-sectional view of a semiconductor package according to example embodiments of the inventive concepts, FIG. 3 is a cross-sectional view illustrating a first semiconductor chip of the semiconductor package of FIG. 2, FIG. 4 is a cross-sectional view illustrating a second semiconductor chip of the semiconductor package of FIG. 2, FIG. 5 is an enlarged view illustrating an enlarged portion 'A' of FIG. 2.

First, referring to FIGS. 1 and 2, a semiconductor package according to example embodiments may be a high bandwidth memory (HBM) chip. The semiconductor package according to example embodiments may include first and second semiconductor chip stacks ST1 and ST2 sequentially stacked on a buffer die 10, and an uppermost semiconductor chip stack ST3 stacked on the first and second semiconductor chip stacks ST1 and ST2.

The buffer die 10 may be an interposer or a logic circuit chip. The buffer die 10 includes a buffer semiconductor substrate 1. The buffer semiconductor substrate 1 has a first surface 1*a* and a second surface 1*b* which are opposite to each other. A buffer interlayer insulating layer 3 is disposed on the first surface 1*a* of the buffer semiconductor substrate 1. Buffer wirings 5 are disposed in the buffer interlayer insulating layer 3. First buffer conductive pads 7 are disposed under the buffer interlayer insulating layer 3. The first buffer conductive pads 7 and the buffer interlayer insulating layer 3 are covered with a first buffer passivation layer 9. Second buffer conductive pads 27 are disposed in the first buffer passivation layer 9 and are in contact with the first buffer conductive pads 7. Solder balls 33 are bonded to the second buffer conductive pads 27. The second surface 1*b* of the buffer semiconductor substrate 1 is covered with a buffer protective layer 15. A buffer through-via 11 may pass through portions of the buffer semiconductor substrate 1, the buffer protective layer 15, and the buffer interlayer insulating layer 3 to become in contact with one of the buffer wirings 5. A buffer via insulating layer 13 is interposed between the buffer through-via 11 and the buffer semiconductor substrate 1. The buffer protective layer 15 is covered with a second buffer passivation layer 19. A third buffer conductive pad 35 is disposed in the second buffer passivation layer 19 and connected to the buffer through-via 11.

The first and second semiconductor chip stacks ST1 and ST2 may each have the same structure. In example embodiments, the semiconductor package is illustrated as including two semiconductor chip stacks (first and second semiconductor chip stacks ST1 and ST2), but the number of semiconductor chip stacks is not limited thereto and is variable.

Each of the first and second semiconductor chip stacks ST1 and ST2 may include a plurality of first semiconductor chips CH1A and a second semiconductor chip CH1B disposed on the plurality of first semiconductor chips CH1A. Each of the first and second semiconductor chip stacks ST1 and ST2 may include two or more first semiconductor chips CH1A. Each of the first and second semiconductor chip stacks ST1 and ST2 may include the same number of first semiconductor chips CH1A.

In example embodiments, although it is illustrated that each of the first and second semiconductor chip stacks ST1 and ST2 has a structure in which two first semiconductor chips CH1A and one second semiconductor chip CH1B are stacked, the number of the first semiconductor chip CH1A is not limited thereto and is variable.

The first semiconductor chip CH1A and the second semiconductor chip CH1B may be memory chips. The memory chip may be, for example, DRAM, NAND Flash, SRAM, MRAM, PRAM, or RRAM.

A mold layer MD may cover an upper surface of the buffer die 10, side surfaces of the first and second semiconductor chip stacks ST1 and ST2, and the uppermost semiconductor chip stack ST3. The mold layer MD may include, for example, an insulating resin such as an epoxy-based molding compound (EMC). The mold layer MD may further include a filler, and the filler may be dispersed in the insulating resin. The filler may include, for example, silicon oxide ($SiO_2$).

An upper surface of the mold layer MD may be stacked on the semiconductor chip stacks ST1 and ST2 to form a coplanar surface with an upper surface of the uppermost semiconductor chip stack ST3.

Referring to FIG. 3, the first semiconductor chip CH1A according to example embodiments may include a semiconductor substrate 101. The semiconductor substrate 101 may include, for example, a semiconductor material. The semiconductor substrate 101 may be a silicon single crystal substrate. The semiconductor substrate 101 may include a first surface 101*a* and a second surface 101*b* that are opposite to each other. Although not shown, capacitors or memory cells may be disposed on the second surface 101*b* of the semiconductor substrate 101.

The second surface 101*b* may be covered with a first interlayer dielectric ILD. The first interlayer insulating layer ILD may have a single layer or multilayer structure of at least one of silicon oxide, silicon nitride, silicon oxynitride, and a porous insulating layer.

An upper surface of the first interlayer dielectric ILD may be covered with a second interlayer dielectric IMD. The second interlayer insulating layer IMD may have a single layer or multilayer structure of at least one of silicon oxide, silicon nitride, silicon oxynitride, and a porous insulating layer.

Multilayer wirings 105 may be disposed in the second interlayer dielectric IMD. Each of the wirings 105 may include at least one of copper, tungsten, aluminum, titanium, titanium nitride, and tungsten nitride. Internal vias VA are disposed in the second interlayer insulating layer IMD and may be connected to the wirings 105. The second interlayer insulating layer IMD, the inner vias VA, and the wirings 105 may constitute a wiring part MR. The internal vias VA may include a conductive material same as a material of the wirings 105.

Upper conductive pads 107 may be disposed on the second interlayer insulating layer IMD. The upper conductive pads 107 may be formed of metal such as aluminum. Upper surfaces of the upper conductive pads 107 and the second interlayer insulating layer IMD may be covered with a first passivation layer PL1. The first passivation layer PL1 may have a single layer structure or a multilayer structure of at least one of silicon oxide, silicon nitride, silicon oxynitride, and silicon carbonide nitride.

First conductive pads TE1 may be disposed in the first passivation layer PL1. The first conductive pads TE1 may be provided on the upper conductive pad 107. The first conductive pads TE1 may include, for example, a metal such as copper. The upper conductive pads 107, the first conductive pads TE1, and the first passivation layer PL1 may constitute an upper connection structure US.

Each of the first conductive pads TE1 may have a recessed upper region RC (refer to FIG. 5). The recessed upper region RC of the first conductive pads TE1 may have a concave shape.

Dummy pads DP may be disposed between the first conductive pads TE1 in the first passivation layer PL1. The dummy pads DP may be positioned at the same level as the first conductive pads TEL Each of the dummy pads DP may have the recessed upper region RC like the first conductive pads TE1 as shown in FIG. 5.

The first surface 101*a* of the semiconductor substrate 101 may be covered with a protective layer 110 and a second passivation layer PL2. The protective layer 110 may have, for example, a single layer structure or a multilayer structure of at least one of silicon oxide and silicon nitride. The second passivation layer PL2 may have a single layer structure or a multilayer structure of at least one of silicon oxide, silicon nitride, silicon oxynitride, and silicon carbonide nitride.

A through-via TSV may pass through the protective layer 110, the semiconductor substrate 101, and the first interlayer insulating layer ILD to become in contact with one of the wirings 105. A via insulation layer TVL may be disposed between the through-via TSV and the semiconductor substrate 101. The via insulation layer TVL may include silicon oxide.

Lower conductive pads TE2 may be disposed in the second passivation layer PL2 and may be connected to the through-vias TSV, respectively. The semiconductor substrate 101, the through-via TSV, the via insulating layer TVL, the protective layer 110, the second passivation layer PL2, and the lower conductive pads TE2 may constitute a lower connection structure BS. The lower conductive pads TE2 may overlap the first conductive pads TE1, respectively. The lower conductive pads TE2 may also be referred to as 'upper conductive pads'.

A thickness T1 of the first semiconductor chip CHIA may be 20 μm to 25 μm.

Referring to FIG. 4, the second semiconductor chip CH1B according to example embodiments is the same as the first semiconductor chip CH1A described with reference to FIG. 3, and thus the same reference numbers are used and overlapping descriptions are omitted, except for a redistribution layer RDL formed on the first passivation layer PL1.

The redistribution layer RDL includes an insulating layer 120, and a plurality of redistribution pads RP and a plurality of redistribution vias RV which are disposed in the insulating layer 120.

Referring to FIG. 5, the insulating layer 120 may cover the first conductive pads TE1 and the first passivation layer PL1. The insulating layer 120 may fill the recessed upper region RC of the first conductive pads TEL The insulating layer 120 may include at least one of silicon oxide ($SiO_2$), silicon nitride (SiN), silicon oxynitride (SiON), and silicon carbonide (SiCN).

The plurality of redistribution pads RP may be formed to be in contact with the first conductive pads TE1 within the insulating layer 120. The redistribution pads RP may include copper (Cu).

Each of the plurality of redistribution vias RV may be connected under each of the plurality of redistribution pads RP. The redistribution pad RP and the redistribution via RV may be integrally connected to each other to have a 'T'-shaped cross section.

The redistribution via RV may be in contact with the recessed upper region RC of the first conductive pad TE1, and thus a lower end of the redistribution via RV may be positioned at a lower level than an upper end of the upper conductive pad (refer to FIG. 5). The upper end of the first conductive pad TE1 may be positioned at a first level LV1, and the lower end of the redistribution via RV may be positioned at a second level LV2 lower than the first level LV1.

In example embodiments, although it is illustrated that the redistribution layer RDL is formed in a single layer structure, the redistribution layer RDL may be formed in a multilayer structure including a plurality of insulating layers and the redistribution pads RP and redistribution vias RV in the plurality of insulating layers.

A thickness T2 of the second semiconductor chip CH1B may be 30 μm to 40 μm, and a thickness T3 of the redistribution layer may be 10 μm to 5 μm.

Referring back to FIG. 1, the first chip CH1 positioned at a bottom of the first semiconductor chip stack ST1 stacked on the buffer die 10 has a first recess region RC1 including a curved surface. The second chip CH2 stacked on the first chip CH1 of the first semiconductor chip stack ST1 has a second recess region RC2 including a curved surface. The third chip CH3 stacked on the second chip CH2 of the first semiconductor chip stack ST1 has a third recess region RC3 including a curved surface.

Here, the first chip CH1 and the second chip CH2 may be the first semiconductor chips CH1A described above, respectively, and the third chip CH3 may be the second semiconductor chip CH1B.

When the second chip CH2 is stacked on the first chip CH1, the second passivation layer PL2 of the second chip CH2 may be disposed on the first passivation layer PL1 of the first chip CH1. In some example embodiments, the first passivation layer PL1 of the first chip CH1 includes a first recess region including the recessed upper region RC of the first conductive pads TEL A space may be between the second passivation layer PL2 of the second chip CH2 and the first passivation layer PL1 of the first chip CH1 by the first recess region RC1 of the first chip CH1. Accordingly, when the second chip CH2 is stacked on the first chip CH1, the second recess region RC2 of the second chip CH2 may be formed in a more curved shape than the first recess region RC1 to complement the first recess region RC1 of the first chip CH1.

Similarly, when the third chip CH3 is stacked on the second chip CH2, the third recess region RC3 of the third chip CH3 may be formed in a more curved shape than the second recess region RC2 to complement the second recess RC2 region of the second chip CH2.

The second semiconductor chip stack ST2 may be stacked on the first semiconductor chip stack ST1.

A fourth chip CH4 positioned at a bottom of the second semiconductor chip stack ST2 has a fourth recess region RC4 including a curved surface. A fifth chip CH5 stacked on the fourth chip CH4 of the second semiconductor chip stack ST2 has a fifth recess region RC5 including a curved surface. The sixth chip CH6 stacked on the fifth chip CH5 of the second semiconductor chip stack ST2 has a sixth recess region RC6 including a curved surface. Here, the fourth chip CH4 and the fifth chip CH5 may be the first semiconductor chip CH1A described above, respectively, and the sixth chip CH6 may be the second semiconductor chip CH1B.

The redistribution layer RDL may be formed on the third recess region RC3 of the third chip CH3, and thus the fourth chip CH4 may relatively less complement the third recess region RC3 of the third chip CH3 when the fourth chip CH4 is stacked on the third chip CH3. Accordingly, the fourth recess region RC4 of the fourth chip CH4 may have a less curved shape than the third recess region RC3 of the third chip CH3. The fourth recess region RC4 of the fourth chip CH4 may have a curvature of a less than a curvature of the first recess region RC1 of the first chip CH1. Accordingly, a curvature of the fifth chip CH5 stacked on the fourth chip CH4 may be similar to that of the second chip CH2, and a curvature of the sixth chip CH6 stacked on the fifth chip CH5 may be similar to that of the third chip CH3.

The uppermost semiconductor chip stack ST3 positioned on the second semiconductor chip stack ST2 may include a seventh chip CH7, an eighth chip CH8, and a ninth chip CH9, and the seventh chip CH7, the eighth chip CH8, and the ninth chip CH9 may include a seventh recess region RC7, an eighth recess region RC8, and a ninth recess region RC9, respectively. Here, voids may not be generated on an upper surface of the uppermost semiconductor chip stack ST3 because another semiconductor chip stack is not stacked on the uppermost semiconductor chip stack ST3, and thus the uppermost semiconductor chip stack ST3 may include only the first semiconductor chip CH1A. That is, the seventh chip CH7, the eighth chip CH8, and the ninth chip CH9 may be the first semiconductor chip CH1A, respectively. Here, although illustrated that the uppermost semiconductor chip stack ST3 includes three first semiconductor chips CH1A, the uppermost semiconductor chip stack ST3 may include one first semiconductor chip CH1A or two or more first semiconductor chips CH1A.

As described above, when the semiconductor chip stacks ST1 and ST2 are stacked on the buffer die 10, each of the semiconductor chip stacks ST1 and ST2 may include the second semiconductor chip CH1B including the redistribution layer RDL and the insulating layer 120 of the redistribution layer RDL may fill the recessed upper region RC to provide the flat upper surface. Accordingly, the voids between the semiconductor stacks ST1 and ST2 may be reduced or prevented. This improves the reliability of the finally manufactured semiconductor package.

In addition, each of the semiconductor chip stacks ST1 and ST2 may be formed by disposing one second semiconductor chip CH1B including the redistribution layer RDL on the plurality of first semiconductor chips CH1A, thereby reducing overall vertical size of the semiconductor package. The process of forming the redistribution layer may be reduced or minimized, thereby reducing or minimizing increase in cost.

FIGS. 6A to 6J are cross-sectional views sequentially illustrating a process of manufacturing the second semiconductor chip of FIG. 4.

Figure 6A:
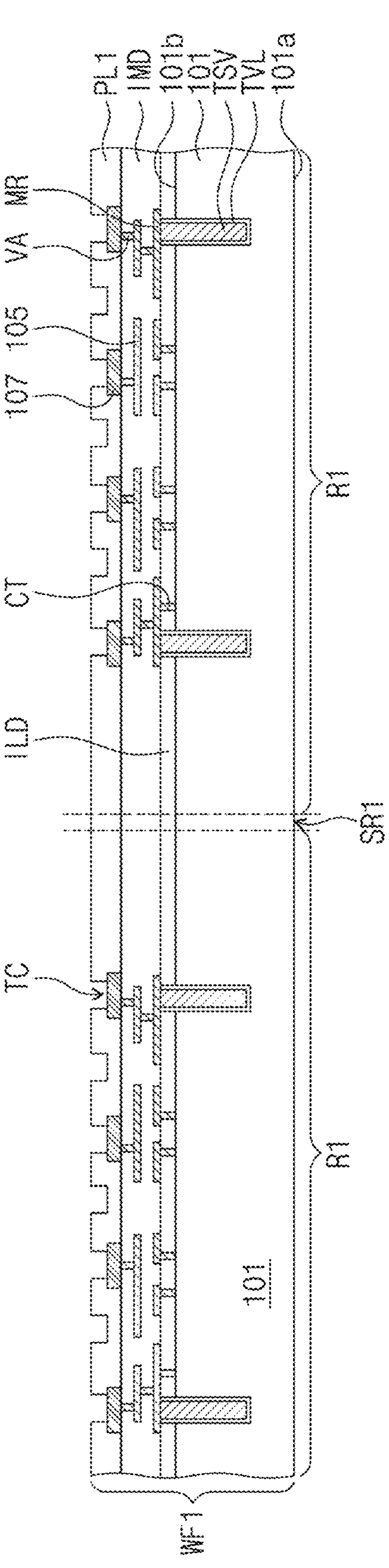
FIGS. 6A to 6J are cross-sectional views sequentially illustrating a process of manufacturing the second semiconductor chip of FIG. 4.

Referring to FIG. 6A, a wafer structure WF1 is prepared. A semiconductor substrate 101 may have device regions R1 and a scribe lane region SR1 therebetween. Transistors (not shown) are formed on a second surface 101*b* of the semiconductor substrate 101. A first interlayer dielectric ILD is formed on the semiconductor substrate 101 to cover the second surface 101*b* of the semiconductor substrate 101. The first interlayer insulating layer ILD and the semiconductor substrate 101 are etched to form a through-via hole, and a via insulating layer TVL is formed to conformally cover an inner wall thereof. After filling the through-via hole with a conductive material, a CMP process or an etch-back process is performed to form a through-via TSV. A multilayer wiring 105, an internal via VA, and a second interlayer dielectric IMD are formed on the first interlayer dielectric ILD. Upper conductive pads 107 are formed on the second interlayer dielectric IMD. A first passivation layer PL1 is formed on the second interlayer dielectric layer IMD. An etching process is performed to form a first trench TC in the first passivation layer PL1. The first trench TC exposes some of the upper conductive pads 107.

Figure 6B:
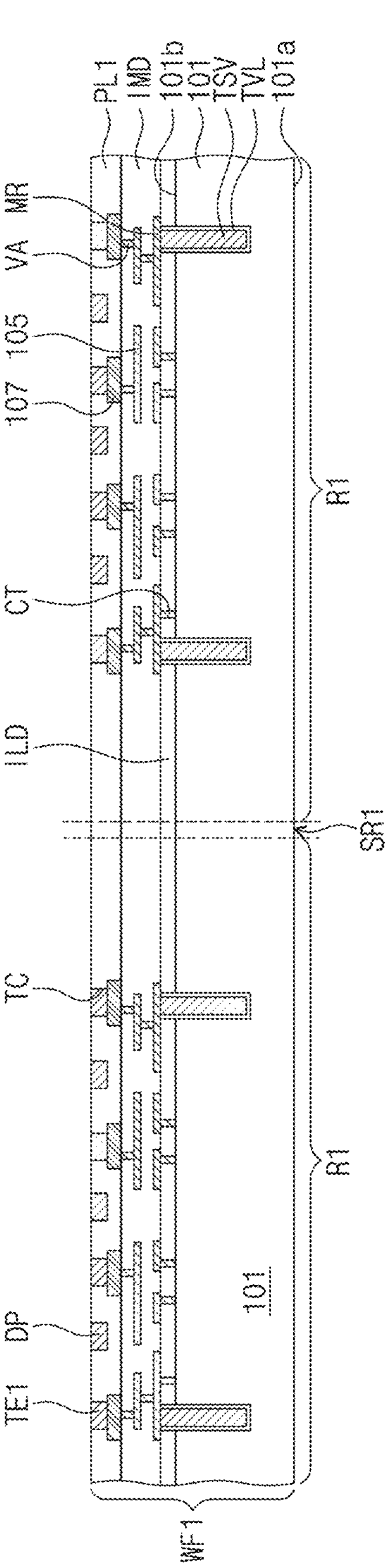

Referring to FIG. 6B, a conductive layer is stacked on the first passivation layer PL1 to fill the first trench TC. Then, a CMP process or an etch-back process is performed to expose an upper surface of the first passivation layer PL1 while first conductive pads TE1 are formed in the first trench TC, simultaneously. In some example embodiments, the upper surfaces of the first passivation layer PL1 and the first conductive pads TE1 are shown as flat, but the upper surface of the first passivation layer PL1 and the first conductive pads TE1 may not be flat because the first passivation layer PL1 and the first conductive pads are formed by the CMP process and the etch-back process (refer FIG. 6G).

Figure 6C:
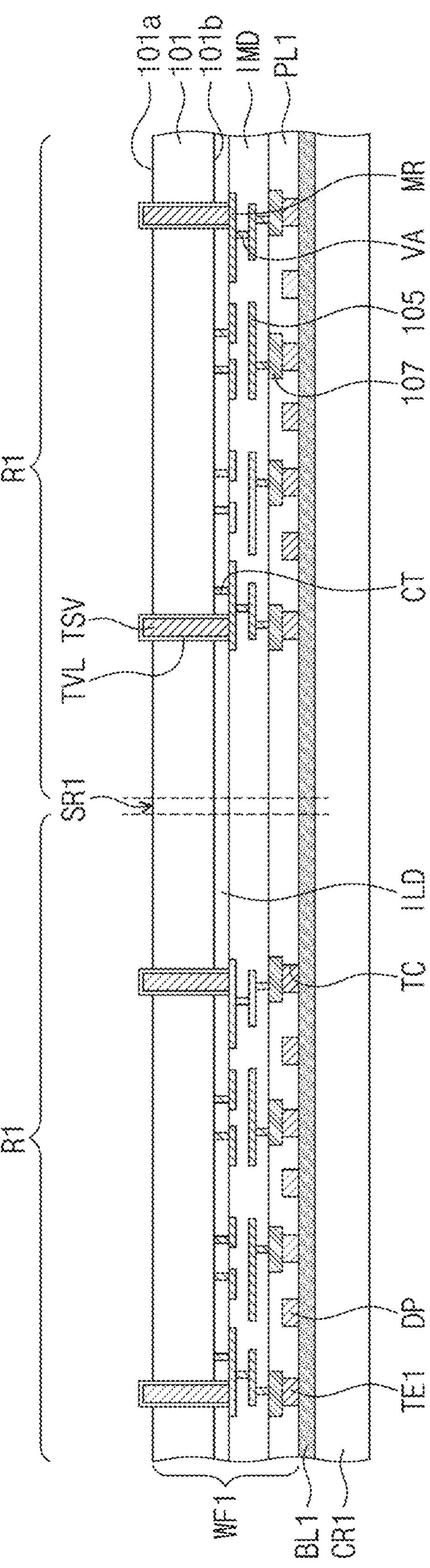

Referring to FIG. 6C, a first carrier substrate CR1 is bonded on the first passivation layer PL1 with a first adhesive layer BL1 interposed therebetween. The wafer structure WF1 is inverted and a back grinding process is performed on a first surface 101*a* of the semiconductor substrate 101. As a result, an upper surface and an upper sidewall of the via insulation layer TVL may be exposed.

Figure 6D:
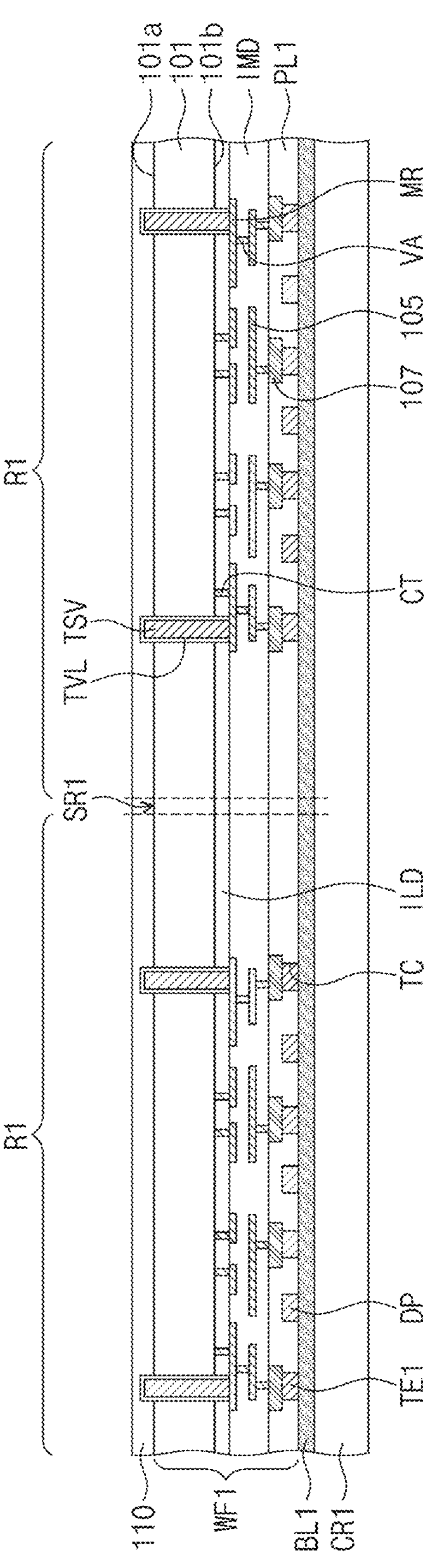

Referring to FIG. 6D, a protective layer 110 is stacked on the first surface 101*a* of the semiconductor substrate 101. The protective layer 110 may also cover the upper surface and the upper sidewall of the via insulating layer TVL.

Figure 6E:
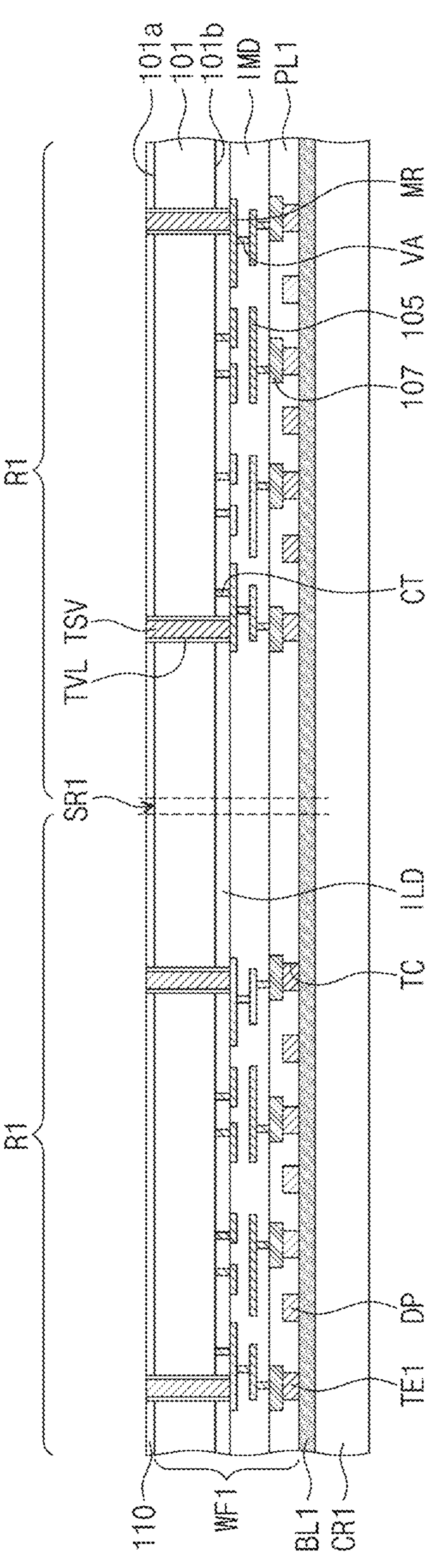

Referring to FIG. 6E, an etch-back process is performed on the protective layer 110 to remove a portion of the protective layer 110 and a portion of the via insulating layer TVL to expose the through-vias TSV.

Figure 6F:
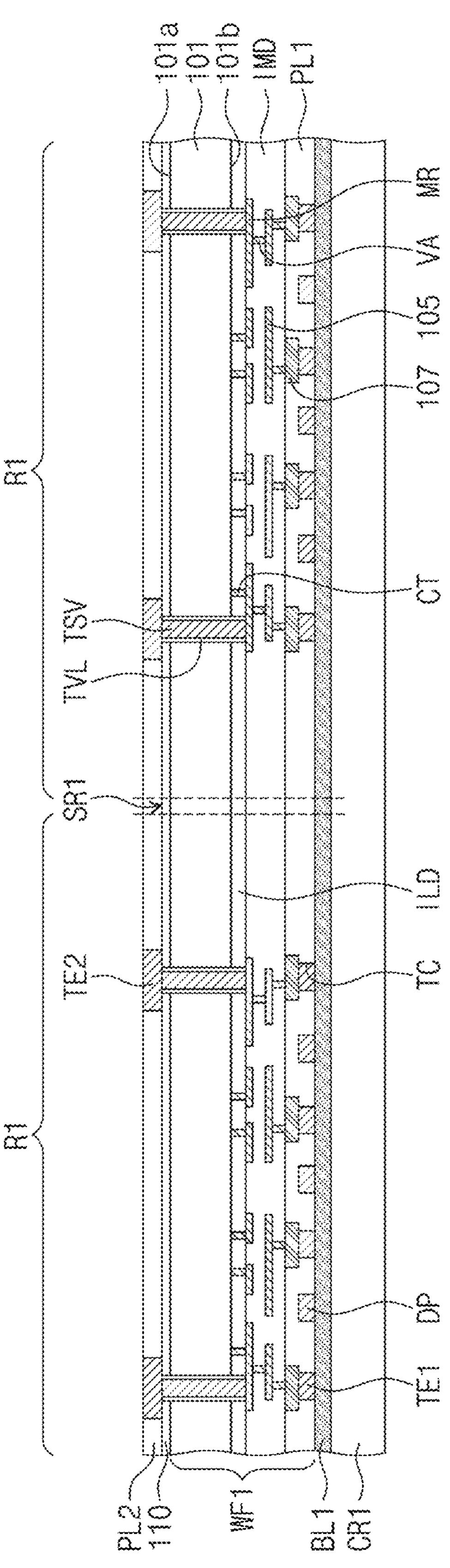

Referring to FIG. 6F, a second passivation layer PL2 is formed on the protective layer 110. A second trench exposing the through-via TSV is formed by etching the second passivation layer PL2. A conductive layer is deposited to fill the second trench, and a CMP process or an etch-back process is performed on the conductive layer to form lower conductive pads TE2.

The first adhesive layer BL1 and the first carrier substrate CR1 are removed.

Figure 6G:
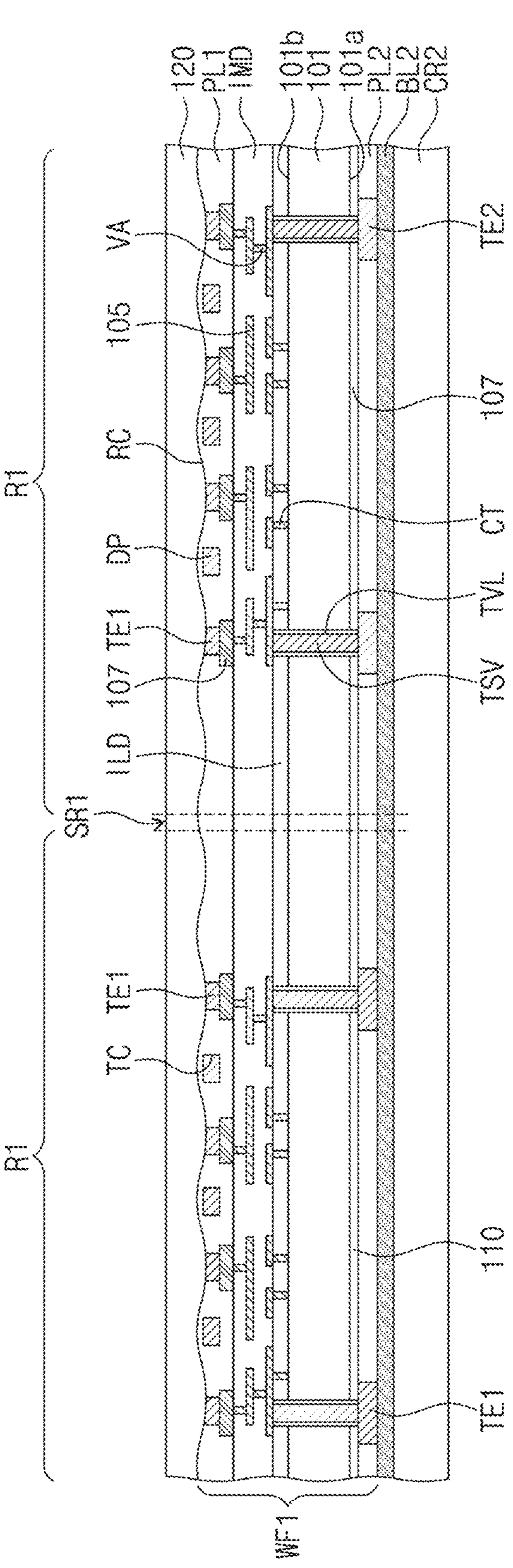

Referring to FIG. 6G, after the wafer structure WF1 is turned over, a second carrier substrate CR2 is bonded on the second passivation layer PL2 with a second adhesive layer BL2 interposed therebetween.

After a liquid composition is coated on the first passivation layer PL1 and cured, an insulating layer 120 is formed. As a result, the insulating layer 120 may be formed to have a flat upper surface. An upper surface of the first passivation layer PL1 may be covered by the insulating layer 120.

As described above, the insulating layer 120 may have a flat upper surface, and thus when stacking a plurality of semiconductor chip stacks ST1 and ST2, voids in a recessed upper region RC of each of semiconductor chips CH1 and CH2 may be reduced. That is, among the semiconductor chips of one semiconductor chip stack, one of the insulating layers 120 may provide a flat upper surface, and thus the voids in the recessed upper region between the respective semiconductor chips may be reduced.

Figure 6H:
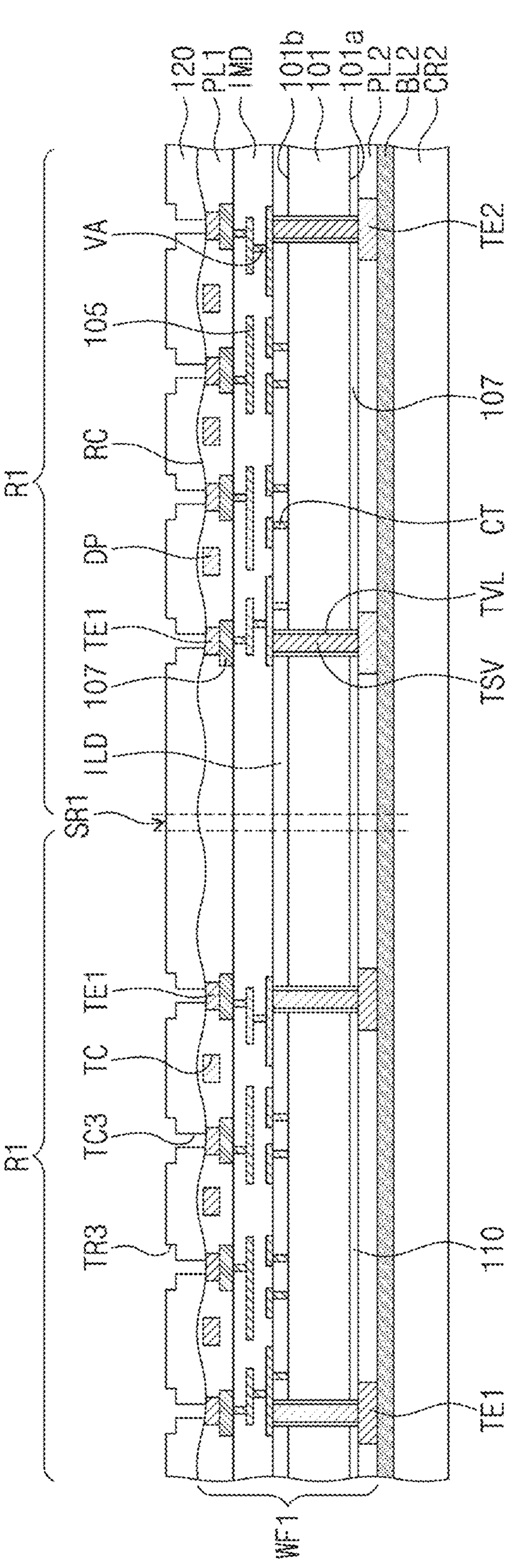
Figure 6I:
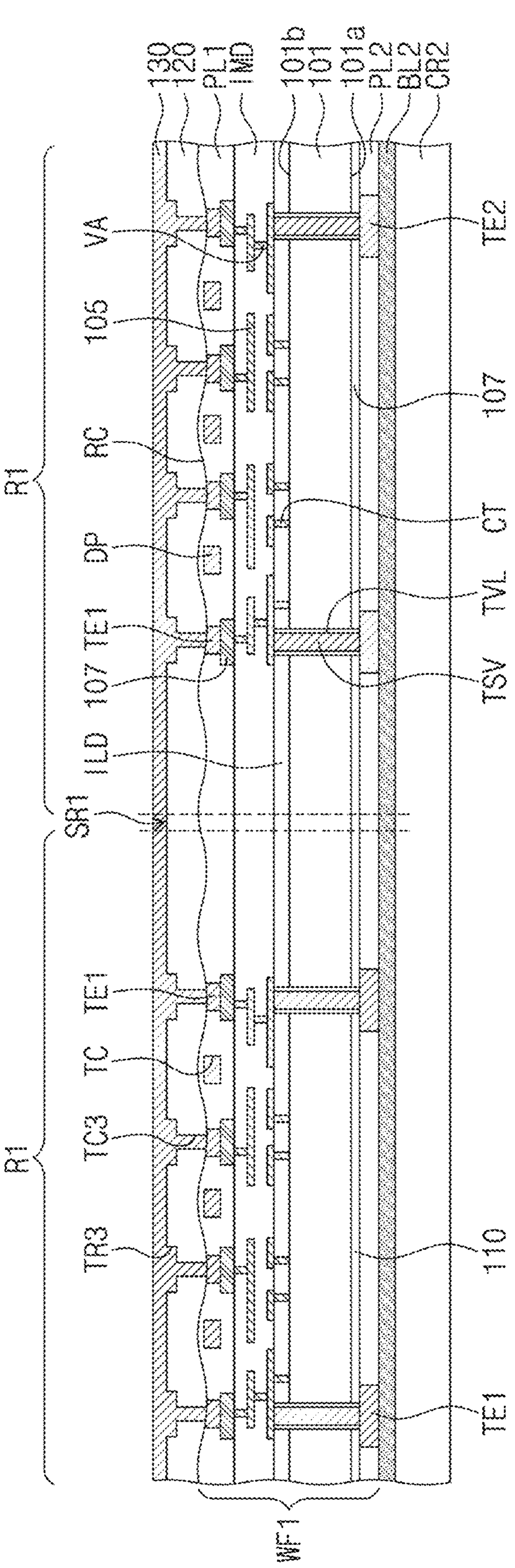

Referring to FIG. 6H, an etching process is performed to form a third trench TC3 in the insulating layer 120. The third trench TC3 may have a dual damascene hole shape. The third trench TC3 exposes portions of the first conductive pads TEL Referring to FIG. 6I, a conductive layer 130 is stacked on the insulating layer 120 to fill the third trench TC3. Then, a CMP process or an etch-back process is performed to expose an upper surface of the insulating layer 120 while forming redistribution pads RP and redistribution vias RV in the third trench TC3, simultaneously.

Figure 6J:
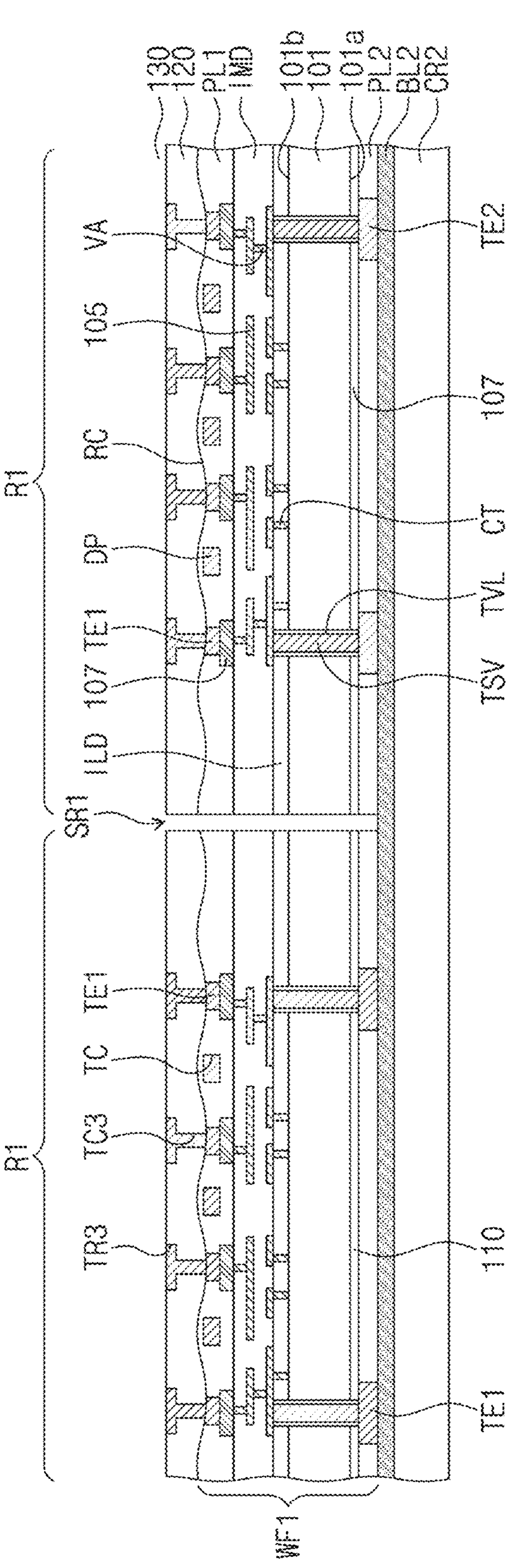

Referring to FIG. 6J, a singulation process (or a sawing process) is performed to irradiate the scribe lane region SR1 with a laser or to cut the wafer structure WF1 using a blade, thereby manufacturing individual semiconductor chips.

As a result, the second semiconductor chip CH1B of FIG. 4 may be manufactured.

Meanwhile, the first semiconductor chip CH1A of FIG. 3 may be manufactured by performing the sawing process after the manufacturing process of FIGS. 6A to 6F described above, and a description thereof will be omitted.

In a semiconductor package according to example embodiments of the inventive concepts, when the semiconductor chip stacks are stacked on the buffer die, each semiconductor chip stack may include the second semiconductor chip including the redistribution layer, and the insulating layer of the redistribution layer may fill the recessed upper region to provide the flat upper surface. Accordingly, the voids between the semiconductor chip stacks may be reduced or prevented. This improves the reliability of the finally manufactured semiconductor package.

In addition, each of the semiconductor chip stacks is formed by disposing one second semiconductor chip including the redistribution layer on the plurality of first semiconductor chips, thereby reducing the overall vertical size of the semiconductor package. The process of forming the redistribution layer maybe reduced or minimized, thereby reducing or minimizing the increase in cost.

While example embodiments are described above, a person skilled in the art may understand that many modifications and variations are made without departing from the spirit and scope of the inventive concepts defined in the following claims. Accordingly, the example embodiments of the inventive concepts should be considered in all respects as illustrative and not restrictive, with the spirit and scope of the inventive concepts being indicated by the appended claims.

What is claimed is:

1. A semiconductor package comprising:
a buffer die;
semiconductor chip stacks stacked on the buffer die, each of the semiconductor chip stacks including a plurality of first semiconductor chips and at least one second semiconductor chip on the plurality of first semiconductor chips; and
a mold layer covering an upper surface of the buffer die and side surfaces of the semiconductor chip stacks,
wherein each of the plurality of first semiconductor chips and the at least one second semiconductor chip includes:
a wiring part including multilayer wirings;
an upper connection structure on the wiring part and having a plurality of upper conductive pads; and
a lower connection structure under the wiring part and having a plurality of lower conductive pads, and
wherein the at least one second semiconductor chip further includes:
a redistribution layer on the upper connection structure and having an insulating layer and a plurality of redistribution pads in the insulating layer;
wherein the redistribution layer further includes a redistribution via in the insulating layer and connected to one of the plurality of redistribution pads thereunder, and
wherein in a corresponding semiconductor chip stack of the semiconductor chip stacks, a number of the redistribution layer is equal to a number of the at least one second semiconductor chip in the corresponding semiconductor chip stack.

2. The semiconductor package of claim 1, wherein the upper connection structure includes:
a first passivation layer covering an upper surface of the wiring part and having the plurality of upper conductive pads therein; and
first conductive pads provided on the plurality of upper conductive pads within the first passivation layer and having a recessed upper region.

3. The semiconductor package of claim 2, wherein the insulating layer of the redistribution layer fills the recessed upper region and covers the first conductive pads and the first passivation layer.

4. The semiconductor package of claim 3, wherein the plurality of redistribution pads are in contact with the first conductive pads.

5. A semiconductor package comprising:
a buffer die;
semiconductor chip stacks stacked on the buffer die, each of the semiconductor chip stacks including a plurality of first semiconductor chips and at least one second semiconductor chip on the plurality of first semiconductor chips;
dummy pads; and
a mold layer covering an upper surface of the buffer die and side surfaces of the semiconductor chip stacks,
wherein each of the plurality of first semiconductor chips and the at least one second semiconductor chip includes:
a wiring part including multilayer wirings;
an upper connection structure on the wiring part and having a plurality of upper conductive pads; and
a lower connection structure under the wiring part and having a plurality of lower conductive pads,
wherein the at least one second semiconductor chip further includes:
a redistribution layer on the upper connection structure and having an insulating layer and a plurality of redistribution pads in the insulating layer,
wherein the upper connection structure includes:
a first passivation layer covering an upper surface of the wiring part and having the plurality of upper conductive pads therein; and
first conductive pads provided on the plurality of upper conductive pads within the first passivation layer and having a recessed upper region,
wherein the dummy pads are between the first conductive pads in the first passivation layer, and
wherein the dummy pads are on a same level as the first conductive pads.

6. A semiconductor package comprising:
a buffer die;
semiconductor chip stacks stacked on the buffer die, each of the semiconductor chip stacks including a plurality of first semiconductor chips and at least one second semiconductor chip on the plurality of first semiconductor chips; and
a mold layer covering an upper surface of the buffer die and side surfaces of the semiconductor chip stacks,
wherein each of the plurality of first semiconductor chips and the at least one second semiconductor chip includes:
a wiring part including multilayer wirings;
an upper connection structure on the wiring part and having a plurality of upper conductive pads; and
a lower connection structure under the wiring part and having a plurality of lower conductive pads,
wherein the at least one second semiconductor chip further includes:
a redistribution layer on the upper connection structure and having an insulating layer and a plurality of redistribution pads in the insulating layer,
wherein the upper connection structure includes:
a first passivation layer covering an upper surface of the wiring part and having the plurality of upper conductive pads therein; and
first conductive pads provided on the plurality of upper conductive pads within the first passivation layer and having a recessed upper region,
wherein the redistribution layer further includes a redistribution via in the insulating layer and connected to the plurality of redistribution pads thereunder, and
wherein a lower end of the redistribution via is at a level lower than an upper end of the first conductive pads.

7. The semiconductor package of claim 1, wherein each of the semiconductor chip stacks includes two or more first semiconductor chips.

8. The semiconductor package of claim 1, wherein each of the semiconductor chip stacks includes a same number of the plurality of first semiconductor chips as each other.

9. The semiconductor package of claim 1, further comprising an uppermost semiconductor chip stack stacked on the semiconductor chip stacks and including at least one first semiconductor chip, wherein an upper surface of the uppermost semiconductor chip stack is coplanar with an upper surface of the mold layer.

10. The semiconductor package of claim 1, wherein a thickness of one of the plurality of first semiconductor chips is 20 μm to 25 μm, and wherein a thickness of one of the at least one second semiconductor chip is 30 μm to 40 μm.

11. The semiconductor package of claim 1, wherein a thickness of the redistribution layer is 10 μm to 15 μm.

12. The semiconductor package of claim 1, wherein the insulating layer of the redistribution layer includes at least one of silicon oxide ($SiO_2$) and silicon carbonitride (SiCN).

13. The semiconductor package of claim 1, wherein the plurality of redistribution pads include copper (Cu).

14. The semiconductor package of claim 5, wherein each of the semiconductor chip stacks includes a same number of the plurality of first semiconductor chips as each other.

15. The semiconductor package of claim 6, wherein each of the semiconductor chip stacks includes a same number of the plurality of first semiconductor chips as each other.

16. The semiconductor package of claim 5, wherein the insulating layer of the redistribution layer fills the recessed upper region and covers the first conductive pads and the first passivation layer.

17. The semiconductor package of claim 16, wherein the plurality of redistribution pads are in contact with the first conductive pads.

18. The semiconductor package of claim 1, wherein the upper connection structure includes:

a first passivation layer covering an upper surface of the wiring part and having an upper conductive pad among the plurality of upper conductive pads therein; and first conductive pads on the upper conductive pad in the first passivation layer and having a recessed upper region.

19. The semiconductor package of claim 5, wherein the redistribution layer further includes a redistribution via in the insulating layer and connected to one of the plurality of redistribution pads thereunder, and wherein a lower end of the redistribution via is at a level lower than an upper end of one of the plurality of upper conductive pads.

20. The semiconductor package of claim 1, wherein the buffer die includes an interposer or a logic circuit chip.

* * * * *